(12) United States Patent
Roberts et al.

(10) Patent No.: US 6,959,019 B2
(45) Date of Patent: Oct. 25, 2005

(54) AHARMONIC INTERLEAVING OF FORWARD ERROR CORRECTED (FEC) SIGNALS

(75) Inventors: Kim B. Roberts, Nepean (CA); Ronald J. Gagnon, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 849 days.

(21) Appl. No.: 09/789,559

(22) Filed: Feb. 22, 2001

(65) Prior Publication Data

US 2002/0114358 A1   Aug. 22, 2002

(51) Int. Cl.[7] ................................................. H04J 3/04
(52) U.S. Cl. ...................................... 370/535; 370/529
(58) Field of Search .............................. 370/529, 535, 370/536, 537, 538, 539, 540

(56) References Cited

U.S. PATENT DOCUMENTS 5,056,087 A * 10/1991 Ferguson .................... 370/540
5,757,802 A * 5/1998 Yoo ............................ 370/474
5,892,771 A * 4/1999 Beaupre et al. ............. 370/476
6,229,824 B1 * 5/2001 Marko ........................ 370/477
6,356,550 B1 * 3/2002 Williams ..................... 370/364

* cited by examiner

Primary Examiner—Ricky Ngo
Assistant Examiner—Christine Ng
(74) Attorney, Agent, or Firm—Kent Daniels; Ogilvy Renault LLP

(57) ABSTRACT

Multiple sub-streams are aharmonicaly interleaved into a high speed data signal by interleaving successive blocks of data from each sub-stream into the high-speed data signal using a predetermined interleaving pattern that is different for two consecutive sequences of N (an integer >2) blocks of data within the high-speed data signal. The resulting irregular distribution of bits of each sub-stream within the high speed data signal reduces the probability that error bursts due to low frequency noise will be localized in one or more of the recovered sub-stream extracted from the high speed data signal. This improved distribution of bit errors across the sub-streams reduces bit error rates in the most highly errored sub-streams, and thereby enables an increase in signal reach.

82 Claims, 4 Drawing Sheets

AHARMONIC INTERLEAVING OF FORWARD ERROR CORRECTED (FEC) SIGNALS

CROSS-REFERENCE TO RELATED APPLICATIONS

This is the first application filed for the present invention.

MICROFICHE APPENDIX

Not Applicable.

TECHNICAL FIELD

The present invention relates to high speed data communications, and in particular to a method and system for aharmonic interleaving of multiple sub-streams into a high speed data signal.

BACKGROUND OF THE INVENTION

In the modern communications network space, signal reach and spectral density are important factors in overall network cost. Assuming other factors to be equal, increases in either signal reach or spectral density tend to reduce overall network cost and are thus very attractive to network service providers.

Signal reach is the distance that an optical signal can be transmitted through a fiber, before conversion to electronic form is required to perform signal regeneration. Using suitable optical amplifiers and optical processing techniques, between 10 and 20 fiber spans (of 40–80 km each) can be traversed by an optical signal before optical/electrical conversion and regeneration are required.

Spectral density, which is normally expressed in terms of bits/sec/Hz (b/s/Hz), is a measure of the extent to which the theoretical maximum bandwidth capacity of an optical channel is utilized. This value is generally determined by dividing the line rate (in bits/sec.) of a channel by the optical frequency (in Hz) of that channel. A spectral density of 1 indicates that, for a given channel, the line rate and optical frequency are equal. Existing telecommunications systems commonly operate at line rates of approximately 2.5 Gb/s to 40 Gb/s. At a line rate of 10 Gb/s, current Wavelength Division Multiplexed (WDM) (or Dense Wave Division Multiplexed (DWDM)) transmission systems achieve a spectral density of approximately 0.1 b/s/Hz. If the line rate is increased to 40 Gb/s, the spectral density increases to approximately 0.4 b/s/Hz, illustrating the advantages of increasing the line rate.

However, increasing the line rate raises a number of difficulties. In particular, at line rates of about 10 Gb/s and higher, the physical (e.g. electrical and optical characteristics) of signal processing equipment and optical fiber have an increasingly important effect on the signal-to-noise ratio at the receiving end of a link, which manifests itself as an increased bit error rate of the regenerated signal. For example, optical signal generators (e.g. lasers and modulators) and optical multiplexers are subject to manufacturing tolerances, which may result in signals in some channels being weaker than signals in other channels. These manufacturing tolerances may also introduce noise into one or more channels, which may contain harmonics of the line rate. Furthermore, it is known that optical cross-talk between adjacent channels does not affect all wavelengths equally, so that some channels may be more prone to optical cross-talk than others.

One known method of addressing these difficulties is to interleave a plurality of parallel FEC encoded sub-streams (e.g. having a line rate of 2.5 Gb/s), into a high-speed signal for transmission through the data link. The sub-streams can be FEC encoded (e.g. using a conventional BCH) to form respective FEC blocks (e.g. of 4608 bits in length), in a manner known in the art. Interleaving FEC blocks has the effect of distributing bits of each sub-stream within the high-speed signal. This, in turn, distributes the effects of noise among the sub-streams, and thereby reduces the probability that the error-correction capacity of the FEC encoding will be exceeded for any one channel.

However, this method results in a recurring harmonic relationship between bits of each sub-stream within the high-speed signal. For example, using a conventional bit-wise interleaving pattern, to interleave 16 sub-streams, one bit of each sub-stream occupies every $16^{th}$ bit of the high-speed signal. Furthermore, a bit of, for example, sub-stream No. 6 always lays between corresponding bits of sub-streams Nos. 5 and 7. This situation renders the high-speed signal vulnerable to patterning of signal degradation, which tends to produce repeating localized bursts of errors within the high-speed signal. Such patterning of signal degradation may, for example, result from noise introduced into the high speed signal by the interleaver, and having a frequency that is an harmonic of the interleaving frequency.

In general, the effects of noise become progressively more pronounced as the frequency of a noise component more closely approximates an harmonic of the high-speed signal, as this tends to produce signal degradation patterning characterized by localized error bursts concentrated within only a few of the sub-steams. This is undesirable because the error rates in the affected sub-streams may be too high to be corrected by the FEC encoding, while unaffected sub-streams will have underutilized error-correction capabilities.

Accordingly, a method and apparatus enabling increased signal reach by distributing the effects of recurring error bursts among interleaved sub-streams, remains highly desirable.

SUMMARY OF THE INVENTION

Thus, an object of the present invention is to provide a method and apparatus for interleaving a plurality of sub-streams such that recurring error bursts are distributed across all of the interleaved sub-streams.

An aspect of the present invention provides a method of interleaving a plurality of sub-streams into a high-speed data signal. Successive blocks of data from each sub-stream are interleaved into the high-speed data signal using a predetermined interleaving pattern that is different for two consecutive sequences of N (an integer >2) blocks of data within the high-speed data signal.

Another aspect of the invention provides an aharmonic interleaver adapted to interleave a plurality of sub-streams into a high-speed data signal. The aharmonic interleaver comprises means for interleaving successive blocks of data from each sub-stream into the high-speed data signal using a predetermined interleaving pattern that is different for two consecutive sequences of N (an integer >2) blocks of data within the high-speed data signal.

Another aspect of the invention provides a method of recovering a plurality of sub-streams aharmonicaly interleaved within a high-speed data signal. Successive blocks of data of each sub-stream are deinterleaved from the high-speed data signal using a predetermined deinterleaving pattern that is different for two consecutive sequences of N (an integer >2) blocks of data within the high-speed data signal.

Another aspect of the invention provides an aharmonic deinterleaver adapted to recover a plurality of sub-streams aharmonically interleaved within a high-speed data signal. The aharmonic deinterleaver comprises means for deinterleaving successive blocks of data of each sub-stream from the high-speed data signal using a predetermined deinterleaving pattern that is different for two consecutive sequences of N (an integer >2) blocks of data within the high-speed data signal.

Another aspect of the invention provides a method of conveying data traffic through a link of a communications network. Successive blocks of data from each one of a plurality of sub-streams are interleaved into a high-speed data signal using a predetermined interleaving pattern that is different for two consecutive sequences of N (an integer >2) blocks of data within the high-speed data signal. The high speed data signal is then transported through the link, and subsequently deinterleaved to recover the plurality of sub-streams.

Another aspect of the invention provides an system for conveying data traffic through a link of a communications network. The system comprises: means for interleaving successive blocks of data from each one of a plurality of sub-streams into a high-speed data signal using a predetermined interleaving pattern that is different for two consecutive sequences of N (an integer >2) blocks of data within the high-speed data signal; means for transporting the high speed data signal through the link; and means for deinterleaving the high seed data signal to recover the plurality of sub-streams.

Each block of data preferably includes at least one bit.

In some embodiments, the number N of blocks within each N-block sequence is equal to the number of substreams.

Each sub-stream may be Forward Error Correction (FEC) encoded. This FEC encoding of each sub-stream may utilize a conventional FEC encoding scheme. In embodiments in which sub-streams are FEC encoded, the FEC encoding or each sub-stream is preferably independent of the FEC encoding of other sub-streams.

In some embodiments, the interleaving pattern is unique for each one of a set of M (an integer $\geq 2$) consecutive N-block sequences of the high speed data signal. The number M of N-block sequences may be equal to the number of sub-streams.

In some embodiments, interleaving of successive blocks of data from each sub-stream into the high-speed data signal may be accomplished by: inverse-multiplexing each one of the sub-streams across N channels; sorting blocks within each channel in accordance with a predetermined channel sort order; and interleaving successive blocks from each of the channels into the high speed data signal.

The respective predetermined sort order of each channel may be unique. In some embodiments, the respective predetermined sort order of any one channel is related to the respective predetermined sort order of an adjacent channel. In some embodiments, the respective predetermined sort order of at least one channel is pseudo-random.

In some embodiments, sorting the blocks within each channel may be accomplished by means of a respective input port of the channel adapted for receiving successive blocks of each sub-stream. The respective input port associated with any one sub-stream is selected based on the predetermined sort order of the channel. The received blocks may then be interleaved in a sequential order of the input ports of the channel. The respective input port associated with any one sub-stream may be different for each channel.

Interleaving successive blocks from each of the channels into the high speed data signal may be accomplished by interleaving one block from each channel into a respective N-block sequence.

In some embodiments, successive blocks of data of each sub-stream -may be deinterleaved from the high-speed data signal by inverse-multiplexing the high speed data signal into N parallel recovered channel signals. Each channel signal includes respective blocks of each sub-stream arranged in accordance with a respective predetermined channel sort order. Respective blocks of each sub-stream are deinterleaved from each channel signal, and the respective blocks of each sub-stream are then sorted.

In some embodiments, sorting of the respective blocks of each sub-stream may be accomplished by means of a respective output port of each channel adapted to forward successive blocks of the sub-stream. The respective output port of each channel is selected based on the predetermined channel sort order. Successive blocks of the sub-stream from each channel may be received through respective input ports. The respective input port associated with each channel is selected based on a desired order of blocks within the recovered sub-stream. Finally, the received blocks can be interleaved in a sequential order of the respective input ports to generate the recovered sub-stream In some embodiments, the respective output port through which successive blocks of any one sub-stream are forwarded is different for each channel.

Thus the present invention enables increased signal reach by facilitating an even distribution of bit errors due to noise across the sub-streams. Aharmonic interleaving produces an irregular distribution of blocks of data (e.g. bits) of each sub-stream within the high-speed data signal, thereby reducing the probability that error bursts resulting from low frequency will be localized within, and thus corrupt, some sub-streams more than others.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
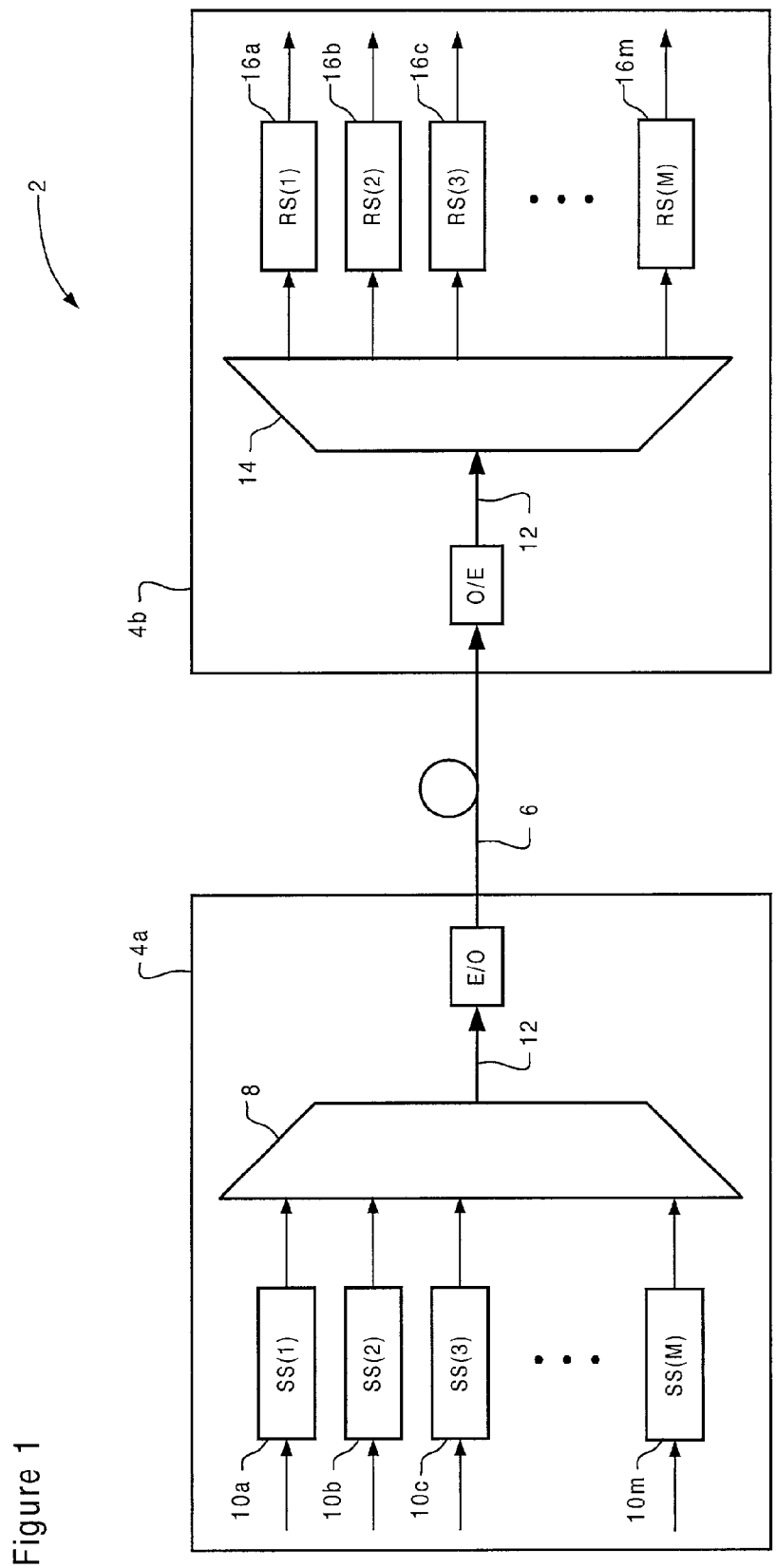
FIG. 1 is a block diagram illustrating exemplary elements of a communications network in which the present invention may be deployed.

The present invention provides a system for interleaving multiple data sub-streams into a high-speed data signal, such that the effects of noise are distributed across all of the interleaved sub-streams. FIG. 1 is a block diagram schematically illustrating principle elements in a system in accordance with the present invention.

As is known in the art, a data communications network 2 comprises a plurality of nodes 4 connected by respective optical links 6. For the purposes of the present invention, each node 4 is considered to be a network element in which received optical signals are optical/electrical converted (e.g. for signal regeneration and/or pointer processing) prior to electrical/optical conversion and subsequent transmission through a downstream link. Exemplary network elements of this type include add-drop-multiplexers (ADMs), routers, and cross-connects. Each link 6 may comprise one of more optical fiber spans, and traverse one or more optical network devices (e.g. optical amplifiers) intermediate the transmitting and receiving nodes 4a, 4b at opposite ends of the link 6. In the illustrated embodiment, the link 6 is illustrated as a single span between the transmitting and receiving nodes 4a, 4b. However, it will be appreciated that the link 6 may include multiple spans, and traverse multiple optical network devices.

As shown in FIG. 1, the system of the present invention comprises an aharmonic interleaver 8 within the transmitting end node 4a, which operates to interleave a plurality of sub-streams 10 into a single high speed data signal 12. The data signal 12 is then electrical/optical converted for transmission through the link 6 to the receiving node 4b. Within the receiving node 4b, an aharmonic deinterleaver 14 is provided for extracting recovered sub-streams 16 from the high-speed data signal 12, following optical/electrical conversion.

Each sub-stream 10 may be Forward Error Correction (FEC) encoded in accordance with a known FEC encoding scheme (e.g. BCH) to form sequential FEC blocks (e.g. of 4608 bits in length) FEC encoding in this manner is known to provide error tolerance in low signal-to-noise ratio environments, by enabling errored bits to be corrected within the receiving node 4b. For example, the conventional BCH(30) encoding scheme enables correction of up to 30 errored bits within a 4608-bit FEC block.

In all cases, aharmonic interleaving of sub-streams 10 ensures that error bursts due to low frequency noise (e.g. within the link 6) are distributed across all of the recovered sub-streams 16. In cases where each of the sub-streams 10 are independently FEC encoded (as opposed to FEC encoding the high speed data signal 12), this reduces the probability that the error correction capabilities of the FEC encoding scheme will be exhausted for any one of the recovered sub-streams 16.

Figure 2:
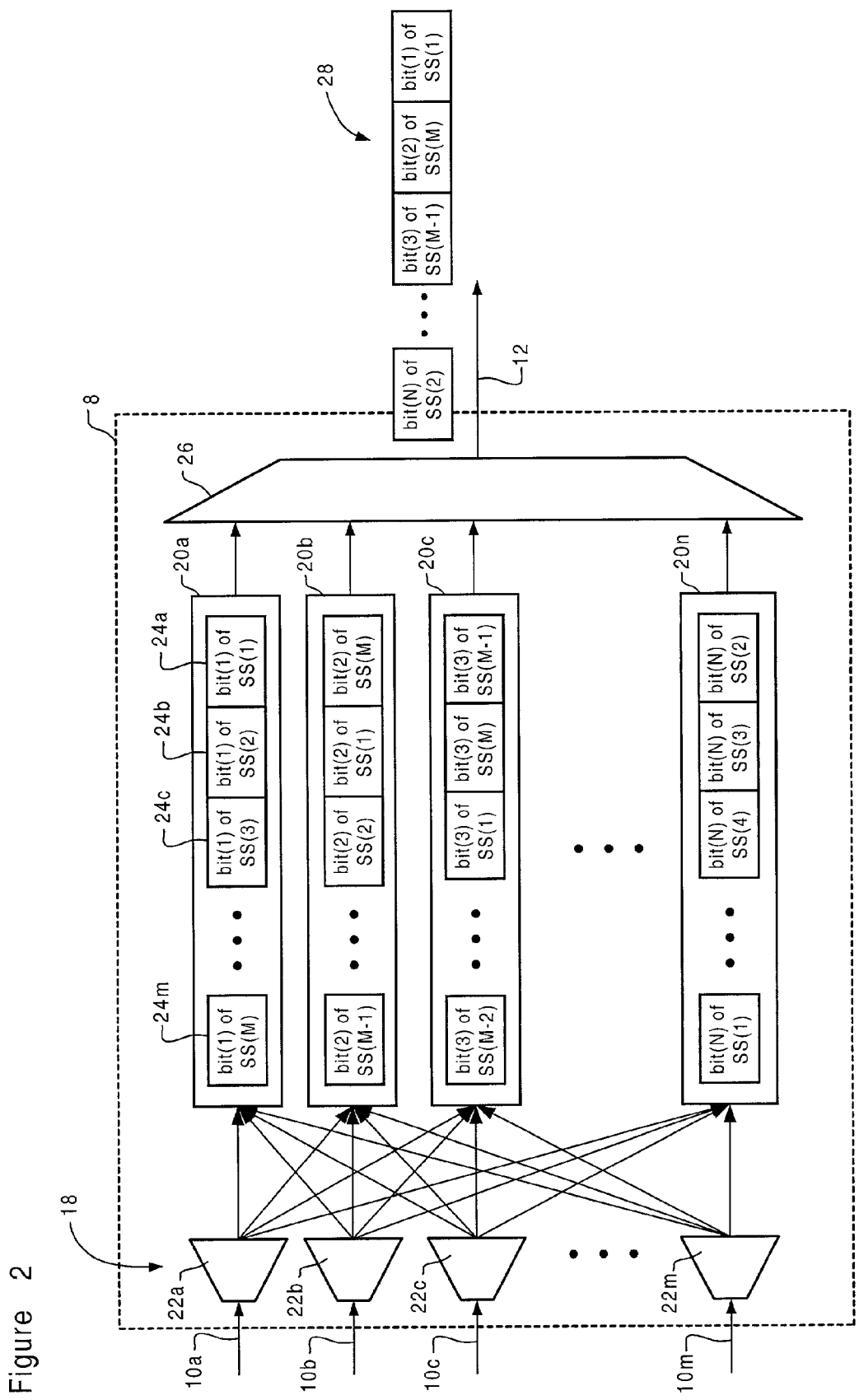
FIG. 2 is a block diagram illustrating operation of an interleaver in accordance with an embodiment of the present invention.
Figure 3:
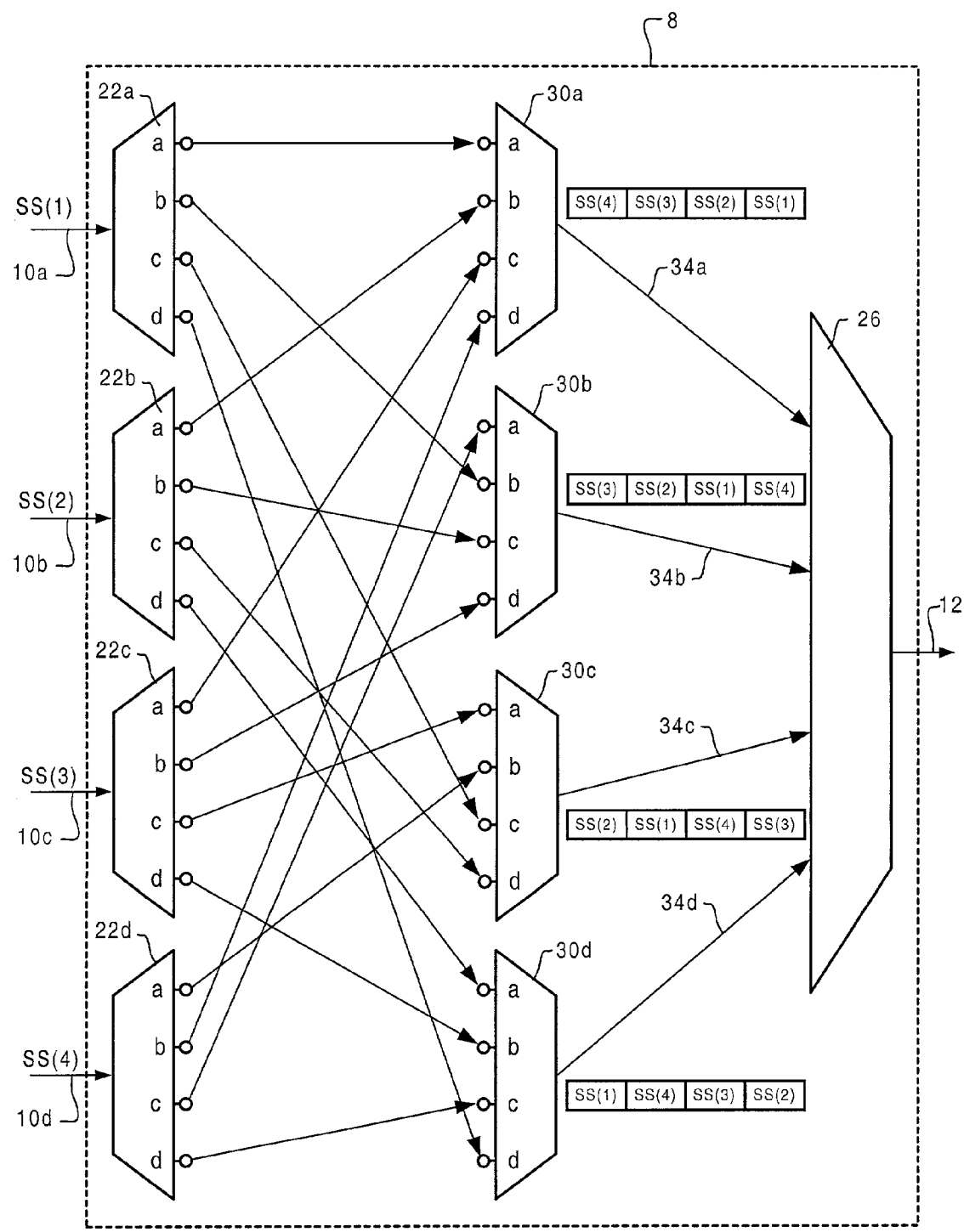
FIG. 3 is a block diagram illustrating exemplary elements of the interleaver of FIG. 2.
Figure 4:
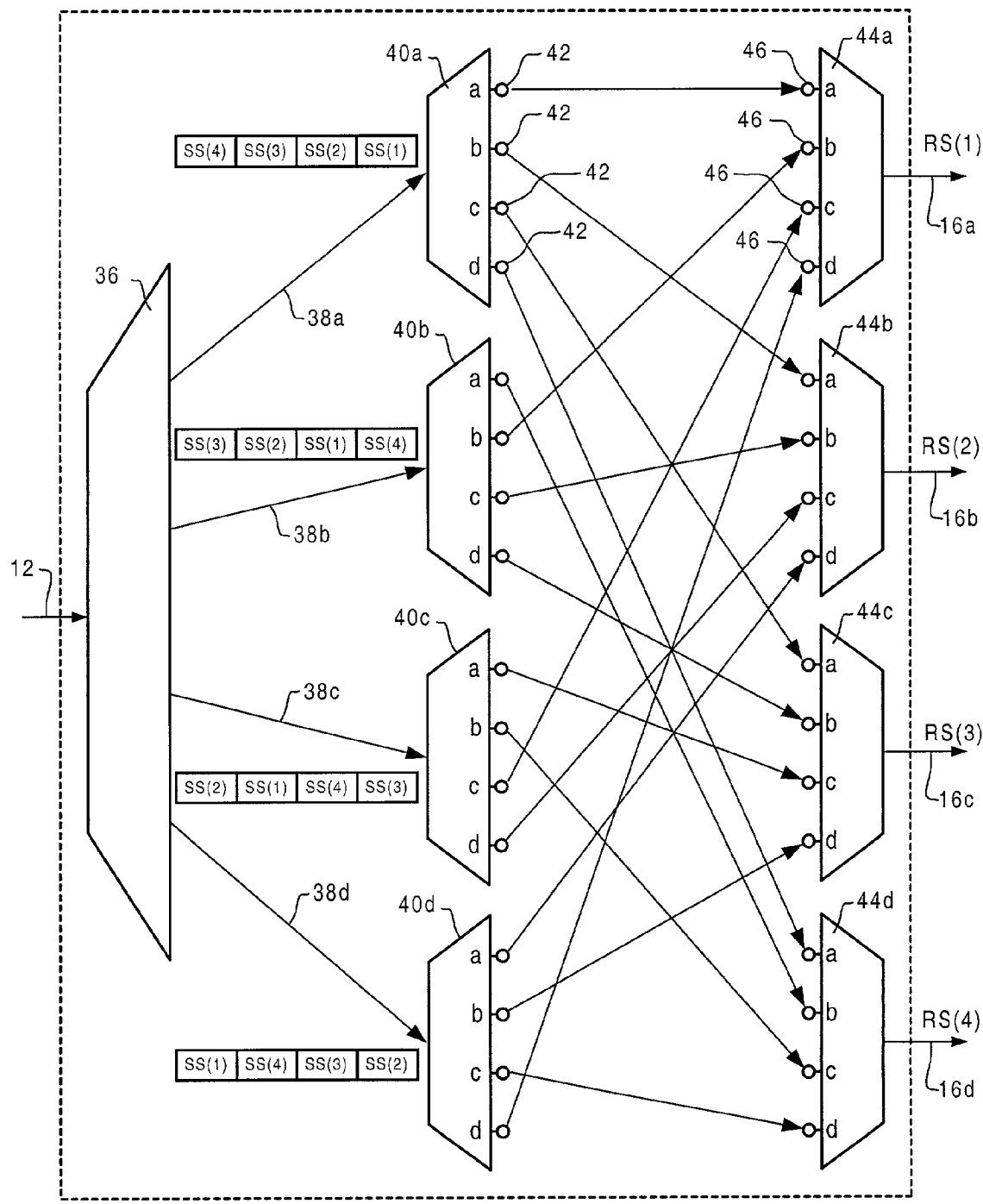
FIG. 4 is a block diagram illustrating exemplary elements of a de-interleaver usable in conjunction with the interleaver of FIG. 2 for recovering interleaved sub-streams.

In general, aharmonic interleaving means that the location of interleaved bits of any one sub-stream 10 within the high speed data signal 12, are aharmonic with respect to the transmission rate (e.g. any one of more of the line rate, a frame rate, or the FEC block rate) of the high speed data signal 12. For example, for a system in which 16 sub-streams 10 are interleaved into the high speed data signal 12, conventional bit-wise interleaving results in the interleaved bits of any one sub-stream 10 being located at regular, 16-bit intervals within the high speed data signal 12. Aharmonic interleaving in accordance with the present invention produces a high speed data signal 12 in which the interleaved bits of any one sub-stream 10 are located at irregular intervals. This can efficiently be accomplished by means of an interleaving pattern in which the ordering of bits within any two consecutive N-bit sequences (where N>2) is different. Preferably, the interleaving pattern covers a set of two or more N-bit sequences, and is designed such that the ordering of bits within each of these N-bit sequences is unique across the set. FIGS. 2 and 3 respectively illustrate operations and elements of an exemplary aharmonic interleaver 8 in accordance with the present invention. An exemplary aharmonic deinterleaver 14 is illustrated in FIG. 4.

FIG. 2 is a block diagram schematically illustrating operations of an exemplary aharmonic interleaver 8 in accordance with an embodiment of the present invention. As shown in FIG. 2, the aharmonic interleaver comprises an inverse multiplexing stage 18 which operates to distribute each substream 10 across a set of N channels 20. This may be accomplished by means of parallel inverse multiplexers 22, each of which operates to forward successive blocks 24 of a respective substream 10 to each one of the N channels 20. Each block 24 may be of any convenient size. Thus, for example, each block 24 may correspond to a single bit; a byte; a word made up of a plurality of bytes; an FEC block; or, in fact, an entire SONET frame. The number, N, of channels 20 is generally arbitrary (provided that N>2), and may be less than, equal to, or greater than the number M of substreams 10, as desired.

Within each channel 20, data blocks 24 received from each of the inverse multiplexers 22 are arranged in series and supplied to a respective input of a signal multiplexer 26. As can be seen from FIG. 2, each channel 20 carries corresponding data blocks 24 from each of the substreams 10. Thus, in the illustrated embodiment, a first channel 20a carries block (1) from each substream 10; a second channel 20b carries blockt (2) of each substream 10; a third channel 20c carries block (3) from each substream 10, etc. Within each channel 20, the data blocks 24 from each substream 10 are arranged in accordance with a predetermined sort order, based on the substream 10 from which each block 24 within the channel 20 was sourced. In accordance with the present invention, at least two different sort orders are used, so that blocks 24 of any one substream 10 will occupy different locations within respective different channels 20. Preferably, N different sort orders are used, so that the sort order of each channel 20 is unique. Thus, the blocks 24 of any one substream 10 will occupy uniquely different locations within each of the channels 20. In general, any arbitrary sort order may be used within each channel 20. Thus, for example, the sort order may be pseudo-random, or alternatively may follow a cyclic pattern extending across all of the N channels 20.

The signal multiplexer 26 operates to sequentially interleave blocks 24 from the channels 20 into the high speed data signal 12. While this interleaving function may be conventional (and thus utilize conventional sequential interleaving hardware and/or software), the result of this operation is an interleaving pattern characterized by an irregular arrangement of blocks 24 within the high speed data signal 12. In particular, the high speed data signal 12 can be considered to comprise a set of sequential N-block sequences 28 formed by the signal multiplexer 26 sequentially interleaving respective blocks 24 from each of the channels 20. The number M of N-block sequences 28 within the set is at least two, and will, in general, equal the number of channels 20. A particularly convenient embodiment utilizes an arrangement in which the number N of channels 20 equals the number of sub-streams 10, and thus also equals the number M of N-block sequences 28 in the set.

In the illustration of FIG. 2, a single N-block sequence 28 of the high speed data signal 12 is shown, which is the result of interleaving a first block 24 from each one of the N channels 20. A successive N-block sequence 28 (not shown) would be formed by interleaving the next block 24 from each one of the channels 20. As may be seen from FIG. 2, the interleaving pattern (i.e. the ordering of blocks 24) in each successive N-block sequence 28 will correspond to the column-wise ordering of blocks 24 across all of the N channels 20, and thus it will be seen that the interleaving pattern of any two successive N-block sequences 28 of the high speed data signal 12 will be different. It will be appreciated that, if the sort order of blocks 24 in each of the channels 20 is unique, the corresponding interleaving pattern of each one of the M N-block sequences 28 will also be unique. The resulting irregular distribution of blocks 24 of any one substream 10 within the high speed data signal 12 reduces the probability that low frequency noise will produce error bursts localized within any one recovered substream 16.

FIG. 3 is a block diagram schematically illustrating principle elements in an exemplary aharmonic interleaver 8 in accordance with an embodiment of the present invention. In the embodiment of FIG. 3, a set of M=4 substreams 10 are interleaved bit-wise (that is, each block 24 corresponds to a single bit) into the high speed data signal 12. This is accomplished by inverse multiplexing each of the substreams 10 across a set of N=4 channels 20, each of which operates to arrange its respective received bits in accordance with a predetermined unique sort order. As shown in FIG. 3, this may conveniently be accomplished by providing each channel 20 with a respective channel interleaver 30. Each channel interleaver 30 comprises a plurality of input ports 32, with each port 32 being connected to receive a bit from a respective one of the substream inverse multiplexers 22. This approach enables the channel interleaver 30 to have a conventional construction, and operate in a conventional manner to interleave bits received at each of its input ports 32 to generate a respective channel signal 34 which is passed to the multiplexer 26. The unique sort order of bits within each channel signal 34 can thus be provided by means of the connectivity pattern between each substream inverse multiplexer 22 and corresponding input ports 32 of each one of the channel interleavers 30. For example, in the embodiment of FIG. 3, the inverse multiplexer 22a of a first substream 10a is connected to input port (a) of channel interleaver 30a; port (b) of channel interleaver 30b; port (c) of channel interleaver 30c; and port (d) of channel interleaver 30d. The connectivity pattern of the inverse multiplexer 22b of a second substream 10b differs from that of the first substream 10a in that it is connected to: port (b) of channel interleaver 30a; port (c) of channel interleaver 30b; port (d) of channel interleaver 30c; and port (a) of channel interleaver 30d. The inverse multiplexer 22c of a third substream 10c is connected to port (c) of channel interleaver 30a; port (d) of channel interleaver 30b; port (a) of channel interleaver 30c; and port (b) of channel interleaver 30d. Finally, the inverse multiplexer 20d of the fourth substream 10d is connected to port (d) of channel interleaver 30a; port (a) of channel interleaver 30b; port (b) of channel interleaver 30c; and port (c) of channel interleaver 30d. Thus it can be seen that the connectivity pattern between each substream inverse multiplexer 22 and the respective ports 32 of each channel interleaver 30 is unique, and differs from the sequential ordering of the substreams 10. In principle, the connectivity pattern between the substream inverse multiplexers 22 and respective ports of the channel interleavers 30 can be arbitrary, and may follow a cyclic pattern (as shown in the embodiment of FIG. 3), or may be pseudo-random. In either case, sequentially interleaving bits received through each of the input ports 32, in a conventional manner (that is, following the sequential order of the ports 32) yields a unique ordering of bits within each of the channel signals 34, as shown in FIG. 3.

FIG. 4 is a block diagram schematically illustrating principle elements in an aharmonic deinterleaver 14 designed for use in conjunction with the aharmonic interleaver 8 of FIG. 3. As described above with respect to FIG. 1, the aharmonic deinterleaver 14 operates to reverse the interleaving operation of the aharmonic interleaver 8, and thereby extract recovered substreams 16 respectively corresponding to each of the input substreams 10. As shown in FIG. 4, this can be accomplished by means of an aharmonic deinterleaver 14 composed of elements mirroring those of the aharmonic interleaver 8. Thus the aharmonic deinterleaver 14 comprises a signal demultiplexer 36 which operates in a conventional manner to separate the incoming high speed data stream 12 into a set of parallel recovered channel signals 38 respectively corresponding to each one of the channel signals 34 that were multiplexed into the high speed data signal 12 within the aharmonic interleaver 8. Each recovered channel signal 38 is supplied to a respective channel deinterleaver 40 which operates in a conventional manner to deinterleave each recovered channel signal 38 to output successive bits of each recovered substream 16 through a respective output port 42. Respective bits of each recovered substream 16 are forwarded from each channel deinterleaver 40 to respective substream multiplexers 44 which operate, again in a conventional manner, to interleave bits received from each channel deinterleaver 40 to generate a respective recovered substream 16. Correct ordering of bits within each recovered substream 16 is ensured by the connectivity pattern between the output ports 42 of each channel deinterleaver 40 and corresponding input ports 46 of the substream multiplexers 44. As may be seen by comparison between FIGS. 3 and 4, this connectivity pattern is a mirror image of the connectivity pattern between substream inverse multiplexers 22 and input ports 32 of the channel interleavers 30 within the aharmonic interleaver 8 of FIG. 3.

Thus it will be seen that the present invention provides a methods and apparatus for aharmonicaly interleaving multiple sub-streams into a high speed data signal, and for deinterleaving the high speed data signal to recover the sub-streams. The resulting irregular distribution of bits of each sub-stream within the high speed data signal reduces the probability that error bursts due to low frequency noise will be localized in one or more of the recovered sub-stream extracted from the high speed data signal. This improved distribution of bit errors across the sub-streams reduces bit error rates in the most highly errored sub-streams, and thereby enables an increase in signal reach.

The embodiment(s) of the invention described above is(are) intended to be exemplary only. The scope of the invention is therefore intended to be limited solely by the scope of the appended claims.

We claim:

1. A method of interleaving a plurality of sub-streams into a high-speed data signal, the method comprising a step of interleaving successive blocks of data from each sub-stream into the high-speed data signal using a predetermined interleaving pattern that is different for two consecutive sequences of N (an integer >2) blocks of data within the high-speed data signal, and at least one of the data blocks in each of the consecutive sequences originates from the same sub-stream, wherein the step of interleaving successive blocks of data from each sub-stream into the high-speed data signal comprises steps of:

inverse-multiplexing each one of the sub-streams across N channels;
sorting blocks within each channel in accordance with a predetermined channel sort order; and
interleaving successive blocks from each of the channels into the high speed data signal.

2. A method as claimed in claim 1, wherein each block of data comprises at least one bit.

3. A method as claimed in claim 1, wherein the number N of blocks within each sequence is equal to the number of sub-streams.

4. A method as claimed in claim 1, wherein each sub-stream is Forward Error Correction (FEC) encoded.

5. A method as claimed in claim 1, wherein the interleaving pattern is unique for each one of a set of M (an integer >2) consecutive N-block sequences of the high speed data signal.

6. A method as claimed in claim 5, wherein the number M of N-block sequences is equal to the number of sub-streams.

7. A method as claimed in claim 1, wherein the respective predetennined sort order of each channel is unique.

8. A method as claimed in claim 7, wherein the respective predetermined sort order of any one channel is related to the respective predetermined sort order of an adjacent channel.

9. A method as claimed in claim 7, wherein the respective predetermined sort order of at least one channel is pseudo-random.

10. A method as claimed in claim 1, wherein the step of sorting the blocks within each channel comprises, for each channel, steps of:
receiving successive blocks of each sub-stream through a respective input port of the channel, the respective input port associated with any one sub-stream being selected based on the predetermined sort order of the channel; and
interleaving the received blocks in a sequential order of the input ports of the channel.

11. A method as claimed in claim 10, wherein the respective input port associated with any one sub-stream is different for each channel.

12. A method as claimed in claim 1, wherein the step of interleaving successive blocks from each of the channels into the high speed data signal comprises a step of interleaving one block from each channel into a respective N-block sequence.

13. An aharmonic interleaver adapted to interleave a plurality of sub-streams into a high-speed data signal, the aharmonic interleaver comprising means for interleaving successive blocks of data from each sub-stream into the high-speed data signal using a predetermined interleaving pattern that is different for two consecutive seqaences of N (an integer >2) blocks of data within the high-speed data signal, and at least one of the data blocks in each of the consecutive sequences originates from the same sub-stream, wherein the means for interleaving blocks from each sub-stream into the high speed data signal comprises:
means for inverse multiplexing each one of the sub-strearns across N parallel channels;
means for sorting blocks within cach channel in accordance with a predetermined channel sort order; and
means for interleaving successive blocks from each of the channels into the high speed data signal.

14. An aharmonic interleaver as claimed in claim 13, wherein each block of data comprises at least one bit.

15. An aharmonic interleaver as claimed in claim 13, wherein the number N of blocks within each sequence is equal to the number of sub-streams.

16. An aharmonic interleaver as claimed in claim 13, wherein each sub-stream is Forward Error Correction (FEC) encoded.

17. An aharmonic interleaver as claimed in claim 13, wherein the interleaving pattern is unique for each N-block sequence within a set of M (an integer $\geq 2$) consecutive N-block sequences of the high speed data signal.

18. An aharmonic interleaver as claimed in claim 17, wherein the number M of N-block sequences is equal to the number of sub-streams.

19. An aharmonic interleaver as claimed in claim 13, wherein the respective predetermined sort order of each channel is unique.

20. An aharmonic interleaver as claimed in claim 19, wherein to respective predetermined sort order of any one channel is related to the respective predetermined sort order of at least one adjacent channel.

21. An aharmonic interleaver as claimed in claim 19, wherein the respective predetermined sort order of at least one channel is pseudo-random.

22. An aharmonic interleaver as claimed in claim 13, wherein the means for sorting the blocks within each channel comprises, for each channel:
a plurality of input ports, each input port being associated with a respective one the sub-streams and adapted to receive successive blocks from the respective associated sub-stream, the input port associated with any one sub-stream being selected based on the predetermined sort order of the channel; and
means for interleaving received blocks in a sequential order of the input ports of the channel.

23. An aharmonic interleaver as claimed in claim 22, wherein the input port associated with any one sub-stream is different for each channel.

24. An aharmonic interleaver as claimed in claim 13, wherein means for interleaving successive blocks from each of the channels into the high speed data signal comprises means for interleaving one block from each channel into a respective N-block sequence.

25. A method of recovering a plurality of sub-streams aharmonicaly interleaved within a high-speed data signal, the method comprising a step of deinterleaving successive blocks of data of each sub-stream from the high-speed data signal using a predetermined deinterleaving pattern that is different for two consecutive sequences of N (an integer >2) blocks of data within the high-speed data signal, and at least one of the data blocks in each of the consecutive sequences originates from the same sub-stream, wherein the step of deinterleaving successive blocks of data of each sub-stream from the high-speed data signal comprises steps of:
inverse-multiplexing the high speed data signal into N parallel recovered channel signals, each channel signal comprising respective blocks of each sub-stream arranged in accordance with a respective predetermined channel sort order;
deinterleaving respective blocks of each sub-stream from each channel signal; and
sorting the respective blocks of each sub-steam.

26. A method as claimed in claim 25, wherein each black of data comprises at least one bit.

27. A method as claimed in claim 25, wherein the number N of blocks within each sequence is equal to the number of sub-streams.

28. A method as claimed in claim 25, wherein each sub-steam is Forward Error Correction (FEC) encoded.

29. A method as claimed in claim 25, wherein the deinterleaving pattern is unique for each N-block sequence within a set of M (an integer ≥2) consecutive N-block sequences of the high speed data signal.

30. A method as claimed in claim 29, wherein the number M of N-block sequences is equal to the number of sub-streams.

31. A method as claimed in claim 25, wherein the respective predetermined sort order of each channel is unique.

32. A method as claimed in claim 31, wherein the respective predetermined sort order of any one channel is related to the respective predetermined sort order of an adjacent channel.

33. A method as claimed in claim 31, wherein the respective predetermined sort order of at least one channel is pseudo-random.

34. A method as claimed in claim 25, wherein the step of sorting the respective blocks of each sub-stream comprises, for each sub-stream, steps of:
    forwarding successive blocks of the sub-stream through a respective output port of each channel, the respective output port of each channel being selected based on the predetermined channel sort order;
    receiving successive blocks of the sub-stream from each channel through respective input ports, the respective input port associated with each channel being selected based on a desired order of blocks within the recovered sub-stream; and
    interleaving the received blocks in a sequential order of the respective input ports.

35. A method as claimed in claim 34, wherein the respective output port through which successive blocks of any one sub-stream are forwarded is different for each channel.

36. An aharmonic deinterleaver adapted to recover a plurality of sub-streams aharmonically interleaved within a high-speed data signal, the aharmonic deinterleaver comprising means for deinterleaving successive blocks of data of each sub-stream from the high-speed data signal using a predetermined deinterleaving pattern, the deinterleaving pattern being different for two consecutive sequences of N (an integer >2) blocks of data within the high-speed data signal, and at least one of the data blocks in each of the consecutive sequences originates from the same sub-stream, wherein the means for deinterleaving blocks from each sub-stream comprises:
    means for inverse-multiplexing the high speed data signal into N parallel recovered channel signals, each channel signal comprising respective blocks of each sub-stream arranged in accordance with a respective predetermined channel sort order;
    means for deinterleaving respective blocks of each sub-stream from each channel signal; and
    means for sorting the respective blocks of each sub-stream.

37. An aharmonic deinterleaver as claimed in claim 36, wherein each block of data comprises at least one bit.

38. An aharmonic deinterleaver as claimed in claim 36, wherein the number N of blocks within each sequence is equal to the number of sub-streams.

39. An aharmonic deinterleaver as claimed in claim 36, wherein each sub-stream is Forward Error Correction (FEC) encoded.

40. An aharmonic deinterleaver as claimed in claim 36, wherein the deinterleaving pattern is unique for each N-block sequence within a set of M (an integer ≥2) consecutive N-block sequences of the high speed data signal.

41. An aharmonic deinterleaver as claimed in claim 40, wherein the number M of N-block sequences is equal to the number of sub-streams.

42. An aharmonic deinterleaver as claimed in claim 36, wherein the respective predetermined sort order of each channel is unique.

43. An aharmonic deinterleaver as claimed in claim 42, wherein the respective predetermined sort order of any one channel is related to the respective predetermined sort order of an adjacent channel.

44. An aharmonic deinterleaver as claimed in claim 42, wherein the respective predetermined sort order of at least one channel is pseudo-random.

45. An aharmonic deinterleaver as claimed in claim 36, wherein the means for sorting the respective blocks of each sub-stream comprises, for each sub-stream,:
    a respective output port of each channel adapted to forward successive blocks of the sub-steam, the respective output port of each channel being selected based on the predetermined channel sort order;
    respective input ports adapted to receive successive blocks of the sub-stream from each channel, the respective input port associated with each channel being selected based on a desired order of blocks within the recovered sub-stream; and
    means for interleaving the received blocks in a sequential order of the respective input ports.

46. An aharmonic deinterleaver as claimed in claim 45, wherein the respective output port through which successive blocks of any one sub-stream are forwarded is different for each channel.

47. A method of conveying data traffic through a link of a communications network the method comprising steps of:
    interleaving successive blocks of data from each one of a plurality of sub-streams into a high-speed data signal using a predetermined interleaving pattern that is different for two consecutive sequences of N (an integer >2) blocks of data within die high-speed data signal, and at least one of the data blocks in each of the consecutive sequences originates from the same sub-stream, wherein the step of interleaving successive blocks of data from each sub-stream into the high-speed data signal comprises steps of:
        inverse-multiplexing each one of the sub-streams across N channels;
        sorting blocks within each channel in accordance with a predetermined channel sort order; and
        interleaving successive blocks from each of the channels into the high speed data signal;
    transporting the high speed data signal through the link; and
    deinterleaving the high speed data signal to recover the plurality of sub-streams.

48. A method as claimed in claim 47, wherein each block of data comprises at least one bit.

49. A method as claimed in claim 47, wherein the number N of blocks within each sequence is equal to the number of sub-streams.

50. A method as claimed in claim 47, wherein each sub-stream is Forward Error Correction (FEC) encoded.

51. A method as claimed in claim 47, wherein the interleaving pattern is unique for each one of a set of M (an integer >2) consecutive N-block sequences of the high speed data signal.

52. A method as claimed in claim 51, wherein the number M of N-block sequences is equal to the number of sub-streams.

53. A method as claimed in claim 47, wherein the respective predetermined sort order of each channel is unique.

54. A method as claimed in claim 53, wherein the respective predetermined sort order of any one channel is related to the respective predetermined sort order of an adjacent channel.

55. A method as claimed in claim 53, wherein the respective predetermined sort order of at least one channel is pseudo-random.

56. A method as claimed in claim 47, wherein the step of sorting the blocks within each channel comprises, for each channel, steps of:
receiving successive blocks of each sub-stream through a respective input port of the channel, the respective input port associated with any one sub-stream being selected based on the predetennined sort order of the channel; and
interleaving the received blocks in a sequential order of the input ports of the channel.

57. A method as claimed in claim 56, wherein the respective input port associated with any one sub-stream is different for each channel.

58. A method as claimed in claim 47, wherein the step of interleaving successive blocks from each of the channels into the high speed data signal comprises a step of interleaving one block from each channel into a respective N-block sequence.

59. A method as claimed in claim 47, wherein the step of deinterleaving successive blocks of data of each sub-stream from the high-speed data signal comprises steps of:
inverse-multiplexing the high speed data signal into N parallel recovered channel signals, each channel signal comprising respective blocks of each sub-stream arranged in accordance with a respective predetermined channel sort order;
deinterleaving respective blocks of each sub-stream from each channel signal; and
sorting the respective blocks of each sub-stream.

60. A method as claimed in claim 59, wherein the respective predetermined sort order of each channel is unique.

61. A method as claimed in claim 60, wherein the respective predetermined sort order of any one channel is related to the respective predetermined sort order of an adjacent channel.

62. A method as claimed in claim 60, wherein the respective predetermined sort order of at least one channel is pseudo-random.

63. A method as claimed in claim 59, wherein the step of sorting the respective blocks of each sub-stream comprises, for each sub-stream, steps of:
forwarding successive blocks of the sub-stream through a respective output port of each channel, the respective output port of each channel being selected based on the predetermined channel sort order;
receiving successive blocks of the sub-stream from each channel through respective input ports, the respective input port associated with each channel being selected based on a desired order of blocks within the recovered sub-stream
interleaving the received blocks in a sequential order of the respective input ports.

64. A method as claimed in claim 63, wherein the respective output port through which successive blocks of any one sub-stream are forwarded is different for each channel.

65. A system for conveying data traffic through a link of a communications network, the system comprising:
means for interleaving successive blocks of data from each one of a plurality of sub-streams into a high-speed data signal using a predetermined interleaving pattern that is different for two consecutive sequences of N (an integer >2) blocks of data within the high-speed data signal, and at least one of the data blocks in each of the consecutive sequences originates from the same sub-stream, wherein the means for interleaving successive blocks of data from each sub-stream into the high-speed data signal comprises:
means for inverse-multiplexing each one of the sub-streams across N channels;
means for sorting blocks within each channel in accordance with a predetermined channel sort order; and
means for interleaving successive blocks from each of the channels into the high speed data signal,
means for transporting the high speed data signal through the link; and
means for deinterleaving the high speed data signal to recover the plurality of sub-streams.

66. A system as claimed in claim 65, wherein each block of data comprises at least one bit.

67. A system as claimed in claim 65, wherein the number N of blocks within each sequence is equal to the number of sub-streams.

68. A system as claimed in claim 65, wherein each sub-stream is Forward Error Correction (FEC) encoded.

69. A system as claimed in claim 65, wherein the interleaving pattern is unique for each one of a set of M (an integer $\geq 2$) consecutive N-block sequences of the high speed data signal.

70. A system as claimed in claim 69, wherein the number M of N-block sequences is equal to the number of sub-streams.

71. A system as claimed in claim 65, wherein the respective predetermined sort order of each channel is unique.

72. A system as claimed in claim 71, wherein the respective predetermined sort order of any one channel is related to the respective predetermined sort order of an adjacent channel.

73. A system as claimed in claim 71, wherein the respective predetermined sort order of at least one channel is pseudo-random.

74. A system as claimed in claim 65, wherein the means for sorting the blocks within each channel comprises, for each channel:
a respective input port of the channel adapted for receiving successive blocks of each sub-stream, the respective input port associated with any one sub-stream being selected based on the predetermined sort order of the channel; and
means for interleaving the received blocks in a sequential order of the input ports of the channel.

75. A system as claimed in claim 74, wherein the respective input port associated with any one sub-stream is different for each channel.

76. A system as claimed in claim 65, wherein the means for interleaving successive blocks from each of the channels into the high speed data signal comprises means for interleaving one block from each channel into a respective N-block sequence.

77. A system as claimed in claim 65, wherein the means for deinterleaving successive blocks of data of each sub-steam from the high-speed data signal comprises:
means for inverse-multiplexing the high speed data signal into N parallel recovered channel signals, each channel signal comprising respective blocks of each sub-stream arranged in accordance with a respective predetennined channel sort order;

means for deinterleaving respective blocks of each sub-stream from each channel signal; and means for sorting the respective blocks of each sub-stream.

78. A system as claimed in claim 77, wherein the respective predetermined sort order of each channel is unique.

79. A system as claimed in claim 78, wherein the respective predetermined sort order of any one channel is related to the respective predetermined sort order of an adjacent channel.

80. A system as claimed in claim 78, wherein the respective predetermined sort order of at least one channel is pseudo-random.

81. A system as claimed in claim 77, wherein the means for sorting the respective blocks of each sub-stream comprises, for each sub-stream, steps of:

a respective output port of each channel adapted to forward successive blocks of the sub-stream, the respective output port of each channel being selected based on the predetermined channel sort order;

respective input ports adapted for receiving successive blocks of the sub-stream from each channel, the respective input port associated with each channel being selected based on a desired order of blocks within the recovered sub-stream; and means for interleaving the received blocks in a sequential order of the respective input ports.

82. A system as claimed in claim 81, wherein the respective output port through which successive blocks of any one sub-stream are forwarded is different for each channel.

* * * * *

UNITED STATES PATENT AND TRADEMARK OFFICE
CERTIFICATE OF CORRECTION

PATENT NO. : 6,959,019 B2
APPLICATION NO. : 09/789559
DATED : October 25, 2005
INVENTOR(S) : Kim B. Roberts and J. Gagnon It is certified that error appears in the above-identified patent and that said Letters Patent is hereby corrected as shown below:

Column 9, line 51 "seqaence" should read --sequence--.

Column 10, line 59 "black" should read -- block--.

Column 12, line 35 "die" should read -- the --.

Signed and Sealed this

Thirty-first Day of October, 2006

JON W. DUDAS
*Director of the United States Patent and Trademark Office*